(12) United States Patent
Zeng et al.

(10) Patent No.: US 11,133,290 B2
(45) Date of Patent: Sep. 28, 2021

(54) CHIP PACKAGE STRUCTURE WITH STACKED CHIPS AND MANUFACTURING METHOD THEREOF

(71) Applicant: Yangtze Memory Technologies Co., Ltd., Wuhan (CN)

(72) Inventors: XinRu Zeng, Wuhan (CN); Peng Chen, Wuhan (CN); Houde Zhou, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/736,741

(22) Filed: Jan. 7, 2020

(65) Prior Publication Data
US 2021/0167039 A1   Jun. 3, 2021

Related U.S. Application Data

(63) Continuation of application No. PCT/CN2019/121821, filed on Nov. 29, 2019.

(51) Int. Cl.
| | |
|---|---|
| *H01L 25/065* | (2006.01) |
| *H01L 23/31* | (2006.01) |
| *H01L 23/00* | (2006.01) |
| *H01L 21/56* | (2006.01) |
| *H01L 25/00* | (2006.01) |
| *H01L 23/538* | (2006.01) |

(52) U.S. Cl.
CPC ......... *H01L 25/0657* (2013.01); *H01L 21/56* (2013.01); *H01L 23/3121* (2013.01); *H01L 23/3135* (2013.01); *H01L 23/5384* (2013.01); *H01L 24/05* (2013.01); *H01L 25/50* (2013.01)

(58) Field of Classification Search
CPC combination set(s) only.
See application file for complete search history.

(56) References Cited

U.S. PATENT DOCUMENTS

| | | | |
|---|---|---|---|
| 9,716,080 B1 * | 7/2017 | Chuang | ................... H01L 24/19 |
| 10,242,965 B2 | 3/2019 | Chiu | |
| 10,643,973 B2 | 5/2020 | Sung | |

(Continued)

FOREIGN PATENT DOCUMENTS

| | | |
|---|---|---|
| CN | 110060984 A | 7/2019 |
| TW | 201737442 A | 10/2017 |

(Continued)

*Primary Examiner* — Mamadou L Diallo
(74) *Attorney, Agent, or Firm* — Winston Hsu

(57) ABSTRACT

A chip package structure including a first chip stack and a redistribution layer is provided. The first chip stack includes a plurality of first chips, a first molding layer and at least one first vertical conductive element. The plurality of first chips are sequentially stacked, wherein each of the plurality of first chips includes at least one first bonding pad, and the first bonding pads are not covered by the plurality of first chips. The first molding layer encapsulates the plurality of first chips. The at least one first vertical conductive element penetrates through the first molding layer, wherein the at least one first vertical conductive element is disposed on and electrically connected to at least one of the first bonding pads. The redistribution layer is disposed on the first chip stack and electrically connected to the at least one first vertical conductive element.

18 Claims, 16 Drawing Sheets

(56) References Cited

U.S. PATENT DOCUMENTS

| | | | |
|---|---|---|---|
| 10,910,347 B2* | 2/2021 | She | H01L 24/20 |
| 2010/0193930 A1* | 8/2010 | Lee | H01L 23/5389 |
| | | | 257/686 |
| 2010/0258929 A1 | 10/2010 | Kim | |
| 2012/0007227 A1* | 1/2012 | Cho | H01L 24/96 |
| | | | 257/686 |
| 2012/0080806 A1* | 4/2012 | Song | H01L 25/0657 |
| | | | 257/777 |
| 2013/0147063 A1* | 6/2013 | Park | H01L 23/5389 |
| | | | 257/777 |
| 2015/0187705 A1* | 7/2015 | Chung | H01L 23/3164 |
| | | | 257/659 |
| 2017/0278821 A1* | 9/2017 | Zhao | H01L 25/105 |

FOREIGN PATENT DOCUMENTS

| | | |
|---|---|---|
| TW | 201828418 A | 8/2018 |
| TW | 201839941 A | 11/2018 |

\* cited by examiner

CHIP PACKAGE STRUCTURE WITH STACKED CHIPS AND MANUFACTURING METHOD THEREOF

CROSS REFERENCE TO RELATED APPLICATIONS

This patent application is a continuation of International Application PCT/CN2019/121821, filed Nov. 29, 2019. The present application is based on and claims priority to International Application PCT/CN2019/121821 filed on Nov. 29, 2019, the contents of which are hereby incorporated by reference in their entirety.

BACKGROUND OF THE INVENTION

1. Field of the Invention

The present invention relates to a chip package structure and a manufacturing method thereof, and more particularly to a chip package structure having a plurality of chips sequentially stacked and a manufacturing method thereof.

2. Description of the Prior Art

In the semiconductor fabrication process, the packaging process can encapsulate a semiconductor component, such as one or more chip(s), to form a semiconductor package structure, so as to protect the semiconductor component. Nowadays, the industries make great efforts to develop the package structure with excellent characteristics. For example, in the 3D semiconductor device (such as 3D memory device), the package structure is developed to have the characteristics such as low cost, small size, short design time, strong protection and/or preferable electrical property (e.g. short electrically connecting distance). However, the conventional package structure cannot meet above excellent characteristics simultaneously.

SUMMARY OF THE INVENTION

The present invention provides a chip package structure having a plurality of chips sequentially stacked and a manufacturing method thereof.

In an embodiment, a chip package structure includes a first chip stack and a redistribution layer. The first chip stack includes a plurality of first chips, a first molding layer and at least one first vertical conductive element. The plurality of first chips are sequentially stacked, wherein each of the plurality of first chips includes at least one first bonding pad, and the first bonding pads are not covered by the plurality of first chips. The first molding layer encapsulates the plurality of first chips. The at least one first vertical conductive element penetrates through the first molding layer, wherein the at least one first vertical conductive element is disposed on and electrically connected to at least one of the first bonding pads. The redistribution layer is disposed on the first chip stack and electrically connected to the at least one first vertical conductive element.

In another embodiment, a manufacturing method of a chip package structure is provided. The manufacturing method includes: stacking a plurality of first chips on a carrier board, wherein each of the plurality of first chips has at least one first bonding pad, and the first bonding pads are not covered by the plurality of first chips; forming at least one first vertical conductive element on at least one of the first bonding pads to being electrically connected to the at least one of the first bonding pads; forming a first molding layer to encapsulate the plurality of first chips to form a first chip stack, wherein the at least one first vertical conductive element penetrates through the first molding layer, and the first chip stack includes the plurality of first chips, the at least one first vertical conductive element and the first molding layer; and forming a redistribution layer on the first molding layer to being electrically connected to the at least one first vertical conductive element.

Due to the design of the chip package structure of the present invention, the chip package structure has a reduced lateral size, and the signal transmitting path between the chips of the chip package structure and the external device may be decreased. Furthermore, the design time and the cost of the chip package structure can be decreased. On the other hand, in the manufacturing process, the reliability of the chip package structure can be improved when the offset of the chip exists.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
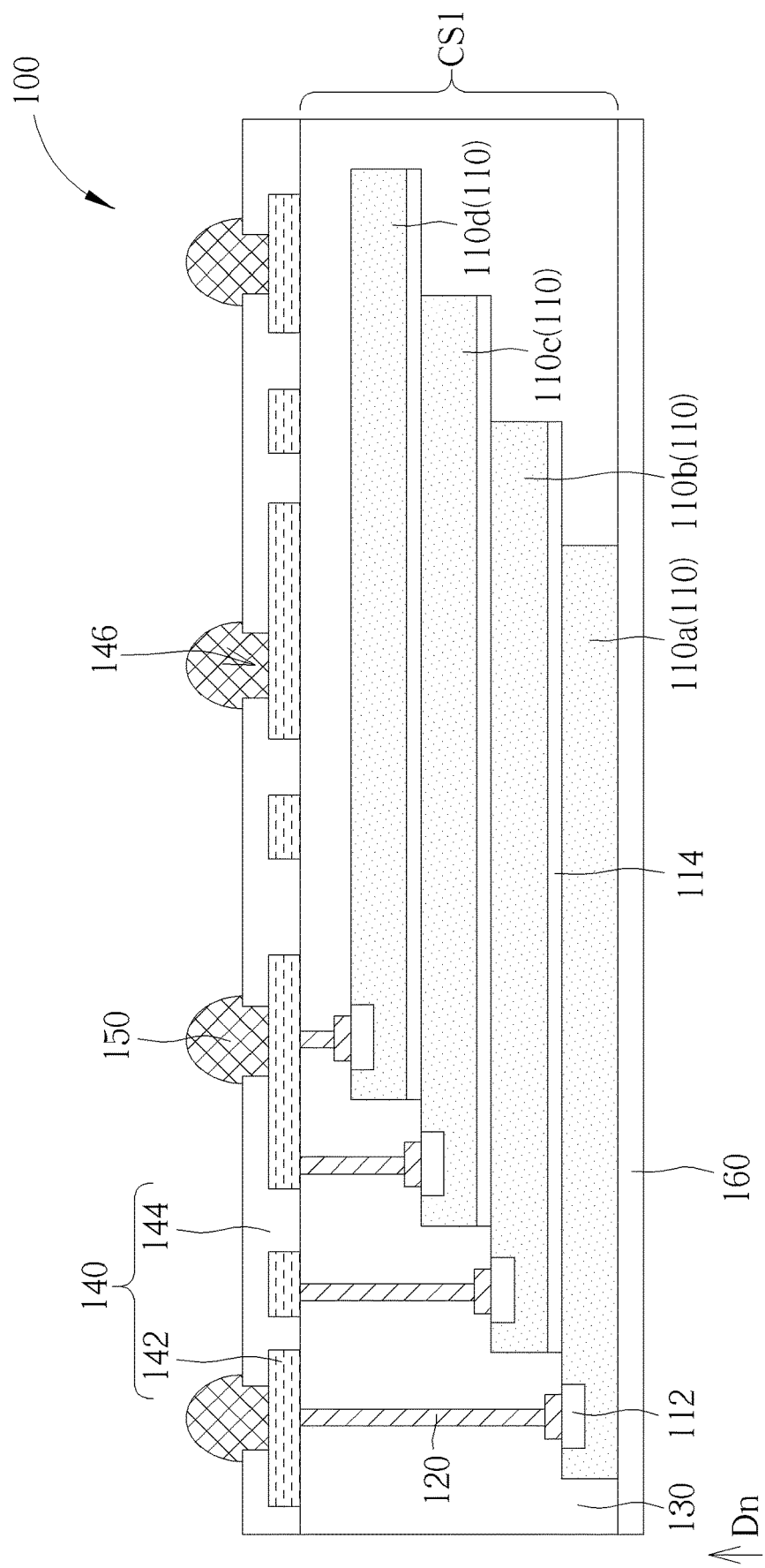
FIG. 1 is a schematic diagram showing a cross-sectional view of a chip package structure according to a first embodiment of the present invention.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

Certain terms are used throughout the description and following claims to refer to particular components. As one skilled in the art will understand, electronic equipment manufacturers may refer to a component by different names. This document does not intend to distinguish between components that differ in name but not in function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10~30% of the value (e.g., ±10%, ±20%, or ±30% of the value).

Although terms such as first, second, third, etc., may be used to describe diverse constituent elements, such constituent elements are not limited by the terms. The terms are used only to discriminate a constituent element from other constituent elements in the specification. These terms do not intend to sort an order of the constituent elements and/or an order of manufacturing process of the constituent elements. The claims may not use the same terms, but instead may use the terms first, second, third, etc. with respect to the order in which an element is claimed. Accordingly, in the following description, a first constituent element may be a second constituent element in a claim.

Referring to FIG. 1, FIG. 1 is a schematic diagram showing a cross-sectional view of a chip package structure according to a first embodiment of the present invention. As shown in FIG. 1, the chip package structure 100 includes a first chip stack CS1 and a redistribution layer 140. In this embodiment, the first chip stack CS1 includes a plurality of first chips 110, a first molding layer 130 and at least one first vertical conductive element 120, but not limited thereto. Any other suitable component may be optionally included in the first chip stack CS1.

The first chips 110 may be formed by the semiconductor fabrication process, and the first chips 110 may be the same or different. For example, in some embodiments, the first chips 110 may be the same and have the memory function; in some embodiments, the first chips 110 may be different, and the first chips 110 have the same function or different functions, but not limited thereto. Any kind of chip may be selected to serve as the first chip 110 based on the requirement(s). Furthermore, in some embodiments, the first chip 110 may have a substrate and an electronic component disposed on the substrate. The electronic component may include a 2D memory unit, a 3D memory unit and/or and other suitable component. For example, the electronic component may be the 3D memory unit, such that the first chip 110 may have the memory function, and the chip package structure 100 may be a 3D memory device, but not limited thereto. Note that, the term "3D memory device" refers to a semiconductor device with vertically-oriented strings of memory cell transistors (i.e., herein as "memory strings") on a laterally-oriented substrate so that the memory strings extend in the vertical direction with respect to the substrate.

In FIG. 1, the first chip stack CS1 includes four first chips 110 (i.e. 110a, 110b, 110c and 110d respectively) sequentially stacked, but not limited thereto. In this embodiment, the first chips 110 may be adhered to each other by a plurality of die attach films (DAF) 114, wherein the die attach films 114 may be respectively disposed on bottom surfaces of three of the first chips 110b, 110c and 110d, but not limited thereto. Moreover, each of the first chips 110 includes at least one first bonding pad 112 configured to be a component of a signal transmitting path between the corresponding first chip 110 and an external device (such as a signal source or a power source, etc.). In order to make FIG. 1 simple and clear, FIG. 1 only shows that each of the first chips 110 has one first bonding pad 112; however, in actual, each of the first chips 110 may have one first bonding pad 112 or a plurality of first bonding pads 112. The first bonding pad 112 may include at least one conductive material, such as metal and/or transparent conductive material, but not limited thereto. The first bonding pads 112 are not covered by the first chips 110, such that some conductive elements (such as vertical conductive elements and/or connecting wires discussed later) may be disposed on and electrically connected to the first bonding pads 112. In this embodiment, the first chips 110 shown in FIG. 1 are stacked in a form of staircase to expose the first bonding pads 112, but not limited thereto.

The first molding layer 130 may encapsulate and cover the first chips 110, so as to protect the first chips 110 and reduce physical damages and/or chemical damages (such as oxidation, damage caused by humidity) to the first chips 110. The first molding layer 130 may include epoxy resin and/or any other suitable molding compound.

Each first vertical conductive element 120 may be disposed on and electrically connected to the at least one of the first bonding pads 112. In FIG. 1, the first chip stack CS1 includes a plurality of first vertical conductive elements 120, and each of the first vertical conductive elements 120 may disposed on one of the first bonding pads 112, but not limited thereto. Also, in this embodiment, each of the first vertical conductive elements 120 may be in contact with the corresponding first bonding pad 112, but not limited thereto.

In addition, the first vertical conductive elements 120 may penetrate through the first molding layer 130, such that the first chips 110 may be electrically connected to a component disposed on the first molding layer 130. In FIG. 1, an extending direction of the first vertical conductive element 120 may be substantially parallel to a normal direction Dn of the first chip stack CS1 (i.e. a vertical direction of a surface of the first chip stack CS1), but not limited thereto. Furthermore, the first vertical conductive element 120 may include at least one conductive material, such as gold, copper, aluminum, silver and/or and other suitable metal, but not limited thereto.

The redistribution layer 140 is disposed on the first chip stack CS1, and the redistribution layer 140 is electrically connected to the first vertical conductive elements 120. In detail, the redistribution layer 140 may include at least one conductive layer 142 and at least one insulating layer 144, wherein the conductive layer 142 may be electrically connected to the first vertical conductive elements 120. The conductive layer 142 may include metal, any other suitable conductive material or a combination thereof, and the insulating layer 144 may include organic material or inorganic material (such as silicon oxide, silicon nitride, silicon oxynitride, any other suitable insulating material or combination thereof). In some embodiments, as shown in FIG. 1, the redistribution layer 140 may include one conductive layer 142 and one insulating layer 144. In some embodiments (not shown in figures), the redistribution layer 140 may include a plurality of conductive layers 142 and a plurality of insulating layers 144.

In the redistribution layer 140 of FIG. 1, the insulating layer 144 may have a plurality of openings 146 to expose a plurality of portions of the conductive layer 142. Moreover, as shown in FIG. 1, the chip package structure 100 may further include a plurality of solder balls 150 being in contact with the exposing portions of the conductive layer 142. That is to say, each of the solder balls 150 corresponds to one of the openings 146. In this case, each of the solder balls 150 may be served as a signal input/output terminal. Through the solder balls 150 (i.e., the signal input/output terminals), the signal from the external device may be inputted into the chip package structure 100, and/or the signal from the chip package structure 100 may be outputted to the external device. Note that each of the solder balls 150 may electrically connected to at least one of the first vertical conductive elements 120.

In particular, the solder balls 150 may be arranged by designing the redistribution layer 140. Therefore, the chip package structure 100 may be easier to be bonded on a circuit board for being electrically connected to the external device. In some embodiments, a distance between adjacent two of the solder balls 150 may be greater than a distance between adjacent two of the first vertical conductive elements 120 corresponding to these solder balls 150, but not limited thereto. In some embodiments, the chip package structure 100 may be a fan-out type package, but not limited thereto.

Since the first chips 110 are stacked together, the lateral size of the chip package structure 100 can be reduced. Since the chip package structure 100 uses the first vertical conductive element 120 and the redistribution layer 140 instead of the conventional wire bonding technique (i.e. a curved wire bonded between the pad and a bonding substrate), the lateral size of the chip package structure 100 can be further reduced (because the two ends of the curved wire cannot be too close), and the signal transmitting path between the first chip 110 and the external device may be decreased. Also, the bonding substrate used in the conventional wire bonding technique does not exist in the chip package structure 100, and therefore, the design time and the cost of the bonding substrate can be saved. On the other hand, in the manufacturing process of the chip package structure 100, the reliability of the formation of the first vertical conductive element 120 and the redistribution layer 140 is greater than the reliability of the conventional wire bonding technique when the offset of the first chip 110 exists.

The chip package structure 100 may optionally include any other suitable component or structure. For example, in FIG. 1, the chip package structure 100 may further include a protecting layer 160 disposed on a side of the first chip stack CS1 opposite to the redistribution layer 140. The protecting layer 160 is configured to provide a stress compensation for the chip package structure 100 to reduce the package warpage phenomenon.

The chip package structure of the present invention is not limited to the above embodiments. Further embodiments of the present invention are described below. For ease of comparison, same components will be labeled with the same symbol in the following. The following descriptions relate the differences between each of the embodiments, and repeated parts will not be redundantly described.

Figure 2:
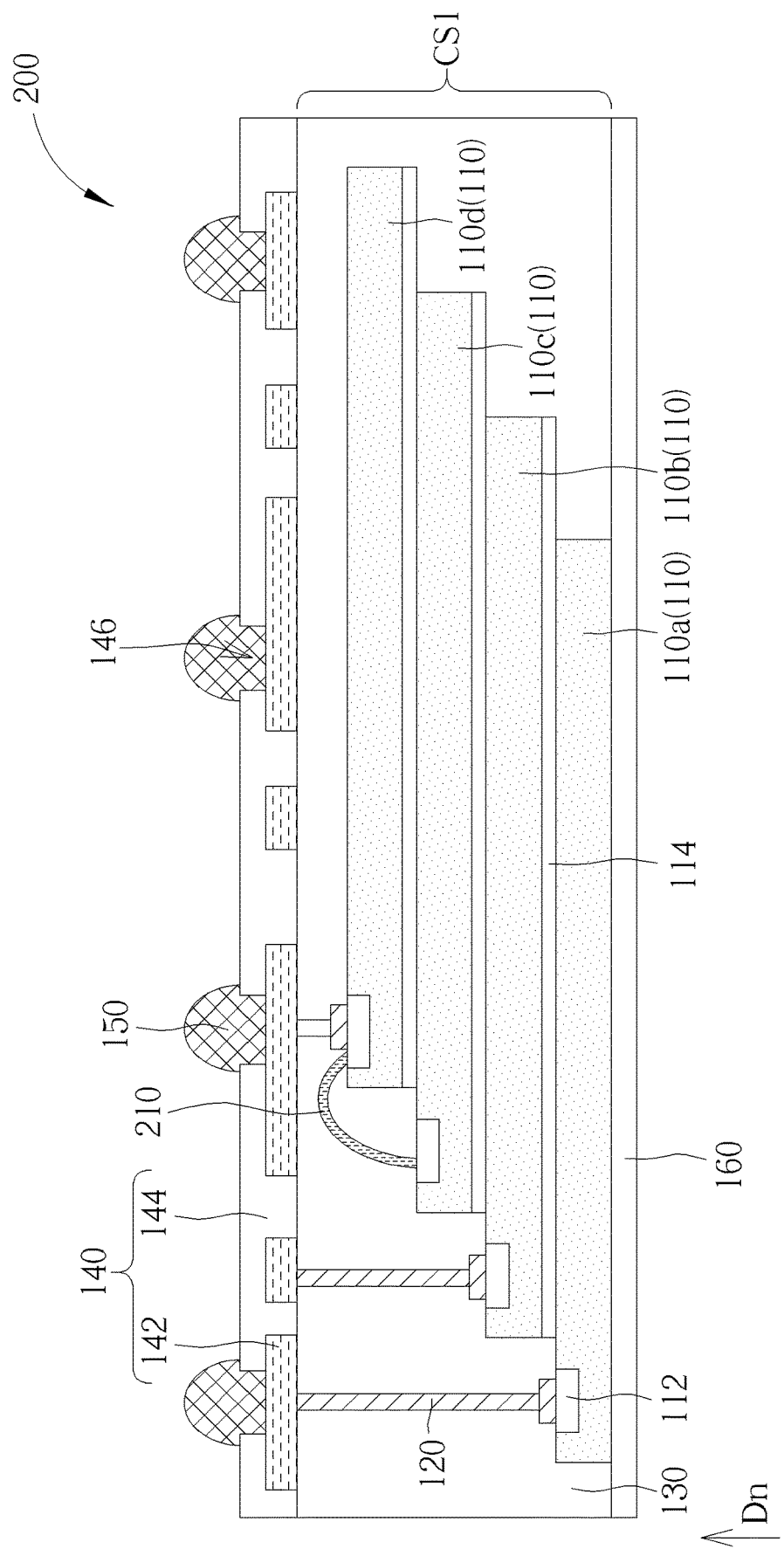
FIG. 2 is a schematic diagram showing a cross-sectional view of a chip package structure according to a second embodiment of the present invention.

Referring to FIG. 2, FIG. 2 is a schematic diagram showing a cross-sectional view of a chip package structure according to a second embodiment of the present invention. In order to make FIG. 2 simple and clear, FIG. 2 only shows that each of the first chips 110 has one first bonding pad 112; however, in actual, each of the first chips 110 may have one first bonding pad 112 or a plurality of first bonding pads 112. As shown in FIG. 2, a difference between this embodiment and the first embodiment is that the chip package structure 200 of this embodiment further includes at least one connecting wire 210, and each connecting wire 210 is electrically connected between two of the first bonding pads 112 respectively belonging to two of the first chips 110, such that one of the first vertical conductive elements 120 may be electrically connected to at least two of the first chips 110. For instance, FIG. 2 shows one connecting wire 210 electrically connected between two of the first bonding pads 112 respectively belonging two first chips 110$c$ and 110$d$, and the uppermost first vertical conductive element 120 is electrically connected to these two first chips 110$c$ and 110$d$, but not limited thereto. The connecting wire 210 may be disposed on any other suitable position, and any suitable number of the connecting wire 210 may be used based on the requirement(s). As an example, in some embodiments, one connecting wire 210 electrically connected between two of the first bonding pads 112 respectively belonging two first chips 110$c$ and 110$d$, and another connecting wire 210 electrically connected between two of the first bonding pads 112 respectively belonging two first chips 110$b$ and 110$c$, such that the uppermost first vertical conductive element 120 (or another first vertical conductive element 120) is electrically connected to these three first chips 110$b$, 110$c$ and 110$d$, but not limited thereto. As another example, in some embodiments, one connecting wire 210 electrically connected between two of the first bonding pads 112 respectively belonging two first chips 110$c$ and 110$d$, another connecting wire 210 electrically connected between two of the first bonding pads 112 respectively belonging two first chips 110$b$ and 110$c$, and still another connecting wire 210 electrically connected between two of the first bonding pads 112 respectively belonging two first chips 110$a$ and 110$b$, such that the uppermost first vertical conductive element 120 (or another first vertical conductive element 120) is electrically connected to these four first chips 110$a$-110$d$, but not limited thereto.

In addition, the connecting wire 210 may be formed of a wire bonding process, and the connecting wire 210 may include at least one conductive material, such as gold, copper, aluminum, silver and/or and other suitable metal, but not limited thereto.

Figure 3:
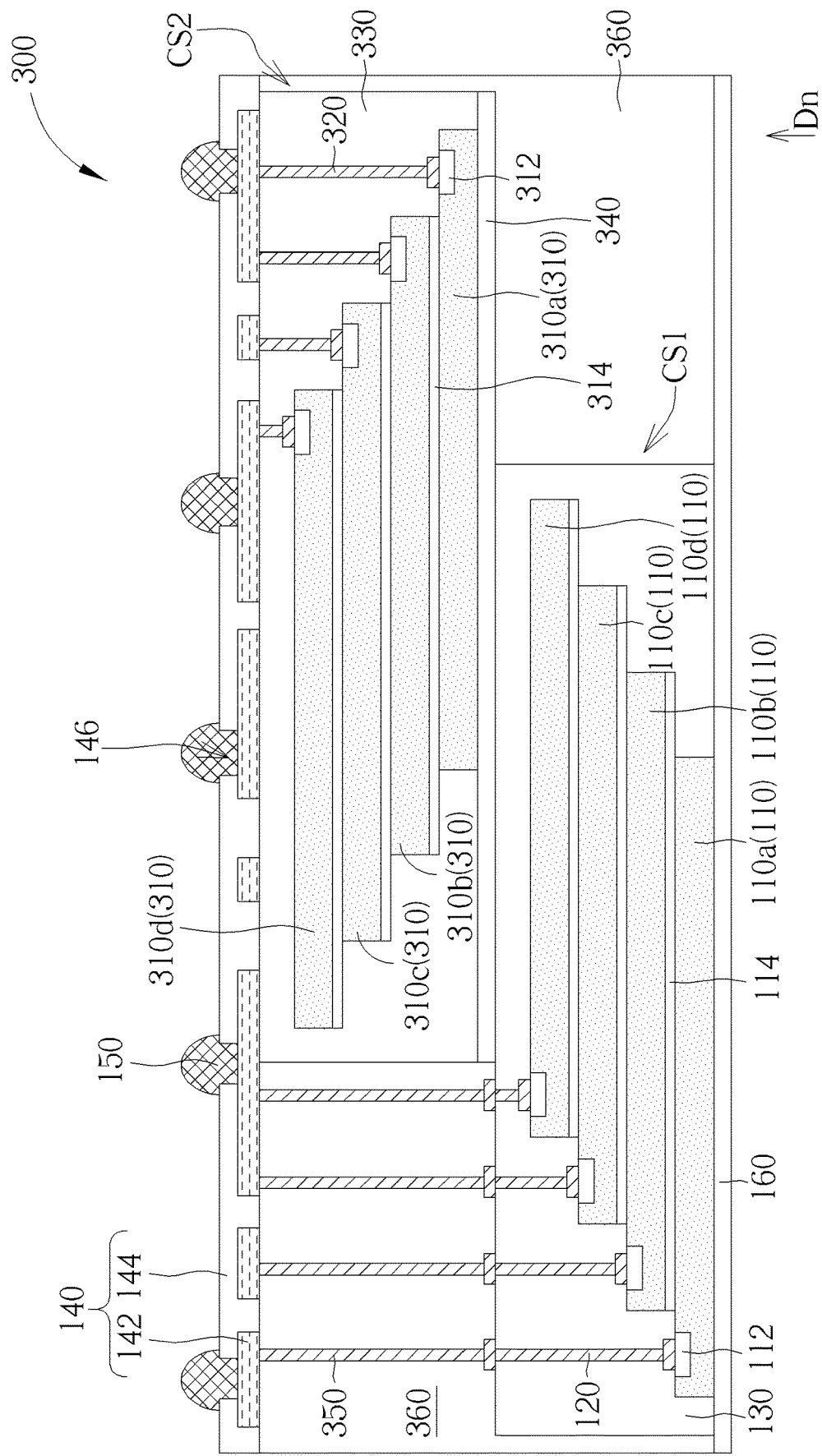
FIG. 3 is a schematic diagram showing a cross-sectional view of a chip package structure according to a third embodiment of the present invention.

Referring to FIG. 3, FIG. 3 is a schematic diagram showing a cross-sectional view of a chip package structure according to a third embodiment of the present invention. In order to make FIG. 3 simple and clear, FIG. 3 only shows that each of the first chips 110 has one first bonding pad 112; however, in actual, each of the first chips 110 may have one first bonding pad 112 or a plurality of first bonding pads 112. As shown in FIG. 3, a difference between this embodiment and the first embodiment is that the chip package structure 300 of this embodiment further includes a second chip stack CS2 disposed between the first chip stack CS1 and the redistribution layer 140. The second chip stack CS2 may include a plurality of second chips 310, a second molding layer 330 and at least one second vertical conductive element 320, but not limited thereto. Any other suitable component may be optionally included in the second chip stack CS2.

The second chips 310 may be formed by the semiconductor fabrication process, and the second chips 310 may be the same or different. For example, in some embodiments, the second chips 310 may be the same and have the memory function; in some embodiments, the second chips 310 may be different, and the second chips 310 have the same function or different functions, but not limited thereto. Any kind of chip may be selected to serve as the second chip 310 based on the requirement(s). Furthermore, in some embodiments, the second chip 310 may have a substrate and an electronic component disposed on the substrate. The electronic component may include a 2D memory unit, a 3D memory unit and/or and other suitable component.

In some embodiments, at least one of the second chips 310 may be the same as at least one of the first chips 110, but not limited thereto. In some embodiments, all of the second chips 310 may be different from all of the first chips 110.

In FIG. 3, the second chip stack CS2 includes four second chips 310 (i.e. 310$a$, 310$b$, 310$c$ and 310$d$ respectively) sequentially stacked, but not limited thereto. In this embodiment, the second chips 310 may be adhered to each other by a plurality of die attach films 314, wherein the die attach films 314 may be respectively disposed on bottom surfaces of three of the second chips 310$b$, 310$c$ and 310$d$, but not limited thereto. Moreover, each of the second chips 310 includes at least one second bonding pad 312 serving as a component on a signal transmitting path between the corresponding second chip 310 and the external device. In order to make FIG. 3 simple and clear, FIG. 3 only shows that each of the second chips 310 has one second bonding pad 312; however, in actual, each of the second chips 310 may have one second bonding pad 312 or a plurality of second bonding pads 312. The second bonding pad 312 may include at least one conductive material, such as metal and/or transparent conductive material, but not limited thereto. The second bonding pads 312 are not covered by the second chips 310, such that some conductive elements (discussed later) may be disposed on and electrically connected to the second bonding pads 312. In this embodiment, the second chips 310 shown in FIG. 3 are stacked in a form of staircase to expose the second bonding pads 312, but not limited thereto.

The second molding layer 330 may encapsulate and cover the second chips 310, so as to protect the second chips 310 and reduce physical damages and/or chemical damages (such as oxidation, damage caused by humidity) to the second chips 310. The second molding layer 330 may include epoxy resin and/or any other suitable molding compound. In some embodiments, the material of the second molding layer 330 may be the same as the material of the first molding layer 130, but not limited thereto.

Each second vertical conductive element 320 may be disposed on and electrically connected to the at least one of the second bonding pads 312. In FIG. 3, the second chip stack CS2 includes a plurality of second vertical conductive elements 320, and each of the second vertical conductive elements 320 may disposed on one of the second bonding pads 312, but not limited thereto. Also, in this embodiment, each of the second vertical conductive elements 320 may be in contact with the corresponding second bonding pad 312, but not limited thereto.

In addition, the second vertical conductive element 320 may penetrate through the second molding layer 330, such that the second chips 310 may be electrically connected to a component disposed on second molding layer 330. In FIG. 3, an extending direction of the second vertical conductive element 320 may be substantially parallel to a normal direction of the second chip stack CS2 (i.e. a vertical direction of a surface of the second chip stack CS2), but not limited thereto. In some embodiments, the extending direction of the second vertical conductive element 320 may be substantially parallel to the extending direction of the first vertical conductive element 120 (i.e., the extending direction of the second vertical conductive element 320 is substantially parallel to the normal direction Dn of the first chip stack CS1), but not limited thereto. Furthermore, the second vertical conductive element 320 may include at least one conductive material, such as gold, copper, aluminum, silver and/or and other suitable metal, but not limited thereto. In some embodiments, the material of the second vertical conductive element 320 may be the same as the material of the first vertical conductive element 120, but not limited thereto.

In FIG. 3, the redistribution layer 140 is electrically connected to the second vertical conductive elements 320. Similarly, in the redistribution layer 140, the insulating layer 144 may further have more openings 146 to expose more portions of the conductive layer 142, and each of the solder balls 150 corresponding to one of the openings 146 may electrically connected to at least one of the first vertical conductive elements 120 and/or at least one of the second vertical conductive elements 320.

In particular, the function of the first chip stack CS1 may be the same as or different from the function of the second chip stack CS2. Also, the number of the first chips 110 may be the same as or different from the second chips 310.

Moreover, the chip package structure 300 may further include a die attach film 340 disposed on a bottom surface of the second chip stack CS2, such that the second chip stack CS2 may be adhered to the first chip stack CS1 by the die attach film 340. In FIG. 3, the second chip stack CS2 is stacked on the first chip stack CS1 in a form of staircase, but not limited thereto. Furthermore, in some embodiments, the first vertical conductive element 120 and the second vertical conductive element 320 may be situated at different portions with respect to the center of the chip package structure 300. For example, in FIG. 3, the first vertical conductive elements 120 may be situated at the left portion with respect to the center of the chip package structure 300, and the second vertical conductive elements 320 may be situated at the right portion with respect to the center of the chip package structure 300, but not limited thereto. In some embodiments, the first vertical conductive elements 120 and the second vertical conductive elements 320 may be situated at the same portion with respect to the center of the chip package structure 300. For instance, the first vertical conductive elements 120 and the second vertical conductive elements 320 may be situated at the left portion with respect to the center of the chip package structure 300. In addition, the second chip stack CS2 shown in FIG. 3 does not cover the first bonding pads 112 and the first vertical conductive elements 120, but not limited thereto.

In particular, the chip package structure 300 may further include a third molding layer 360 and at least one third vertical conductive element 350. The third molding layer 360 may encapsulate the first chip stack CS1 and the second chip stack CS2. In FIG. 3, the third molding layer 360 may be filled in the gap between the first chip stack CS1 and the redistribution layer 140 and the gap between the second chip stack CS2 and the protecting layer 160. The third molding layer 360 may include epoxy resin and/or any other suitable molding compound. In some embodiments, the material of the third molding layer 360 may be the same as the material of the first molding layer 130 and/or the material of the second molding layer 330, but not limited thereto.

Each third vertical conductive element 350 may be disposed on and electrically connected to one of the first vertical conductive elements 120, and each third vertical conductive element 350 may electrically connected to the redistribution layer 140. That is to say, the first bonding pad 112 of the first chip 110 may be electrically connected to the redistribution layer 140 through the first vertical conductive element 120 and the third vertical conductive element 350. In FIG. 3, the chip package structure 300 includes a plurality of third vertical conductive elements 350, and each of the third vertical conductive elements 350 may be in contact with the corresponding first vertical conductive element 120, but not limited thereto.

In addition, the third vertical conductive element 350 may penetrate through the third molding layer 360. In FIG. 3, an extending direction of the third vertical conductive element 350 may be substantially parallel to the normal direction Dn of the first chip stack CS1, but not limited thereto. In some embodiments, the extending direction of the third vertical conductive element 350 may be substantially parallel to the extending direction of the first vertical conductive element 120 and/or the extending direction of the second vertical conductive element 320, but not limited thereto. Furthermore, the second vertical conductive element 320 may include at least one conductive material, such as gold, copper, aluminum, silver and/or and other suitable metal, but not limited thereto. In some embodiments, the material of the third vertical conductive element 350 may be the same as the material of the first vertical conductive element 120 and/or the material of the second vertical conductive element 320, but not limited thereto.

In some embodiments, the chip package structure 300 may further include other chip stack disposed between the second chip stack CS2 and the redistribution layer 140. In this case, the third molding layer 360 may also encapsulate this chip stack disposed between the second chip stack CS2 and the redistribution layer 140.

As the result, since the chip stacks are stacked, the lateral size of the chip package structure 300 can be reduced. Also, the lateral size of the chip package structure 300 can be further reduced due to the usage of the vertical conductive elements. On the other hand, in the manufacturing process, the reliability of forming the vertical conductive elements and the redistribution layer 140 is greater than the reliability of the conventional wire bonding technique when the offset of the chip exists.

Figure 4:
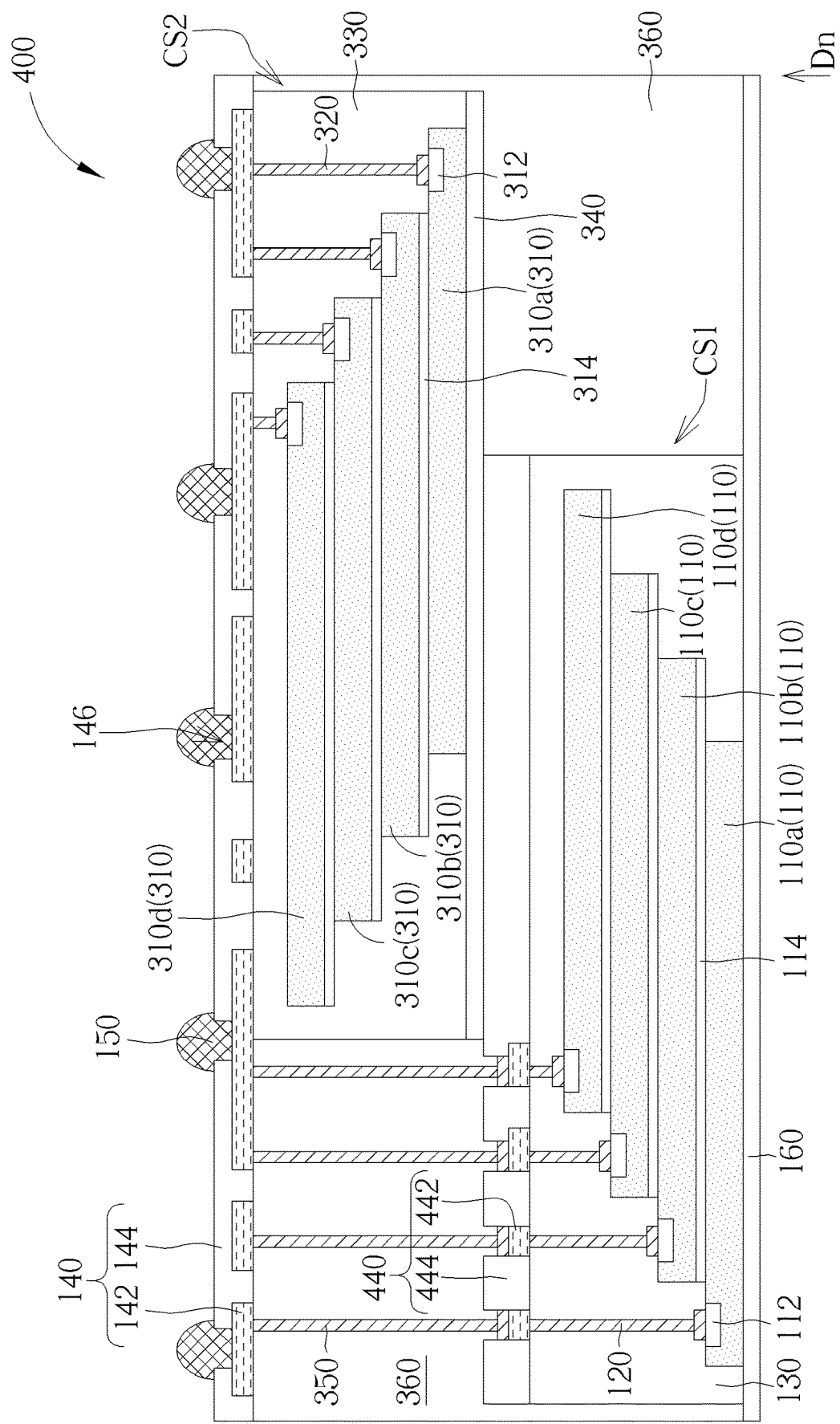
FIG. 4 is a schematic diagram showing a cross-sectional view of a chip package structure according to a fourth embodiment of the present invention.

Referring to FIG. 4, FIG. 4 is a schematic diagram showing a cross-sectional view of a chip package structure according to a fourth embodiment of the present invention. In order to make FIG. 4 simple and clear, FIG. 4 only shows that each of the first chips 110 has one first bonding pad 112 and each of the second chips 310 has one second bonding pad 312; however, in actual, each of the first chips 110 may have one first bonding pad 112 or a plurality of first bonding pads 112, and each of the second chips 310 may have one second bonding pad 312 or a plurality of second bonding pads 312. As shown in FIG. 4, a difference between this embodiment and the third embodiment is that the first chip stack CS1 of the chip package structure 400 of this embodiment further includes a sub redistribution layer 440, wherein the sub redistribution layer 440 is disposed between the first vertical conductive element 120 and the third vertical conductive element 350. In other words, the sub redistribution layer 440 is on the first molding layer 130.

The structure of the sub redistribution layer 440 is similar to the redistribution layer 140. In detail, the sub redistribution layer 440 may include at least one conductive layer 442 and at least one insulating layer 444, wherein the conductive layer 442 may be electrically connected between the first vertical conductive element 120 and the third vertical conductive element 350. The conductive layer 442 may include metal, any other suitable conductive material or a combination thereof, and the insulating layer 444 may include organic material or inorganic material. In some embodiments, as shown in FIG. 3, the sub redistribution layer 440 may include one conductive layer 442 and one insulating layer 444. In some embodiments (not shown in figures), the sub redistribution layer 440 may include a plurality of conductive layers 142 and a plurality of insulating layers 144.

In FIG. 4, due to the sub redistribution layer 440, the third vertical conductive element 350 may not need to be directly disposed on the corresponding first vertical conductive element 120. That is to say, the third vertical conductive element 350 and first vertical conductive element 120 corresponding to each other may be staggered in the normal direction Dn of the of the first chip stack CS1. Thus, the third vertical conductive element 350 may be disposed at any other suitable position. Furthermore, in this case, the second chip stack CS2 shown in FIG. 4 may overlap the first bonding pad 112 of the first chip 110d and the uppermost first vertical conductive element 120, but not limited thereto. As the result, the overlapping area of the first chip stack CS1 and the second chip stack CS2 is enhanced, so as to decrease the lateral size of the chip package structure 400.

Exemplary methods for manufacturing the aforementioned chip package structures are disclosed in the following.

Figure 5:
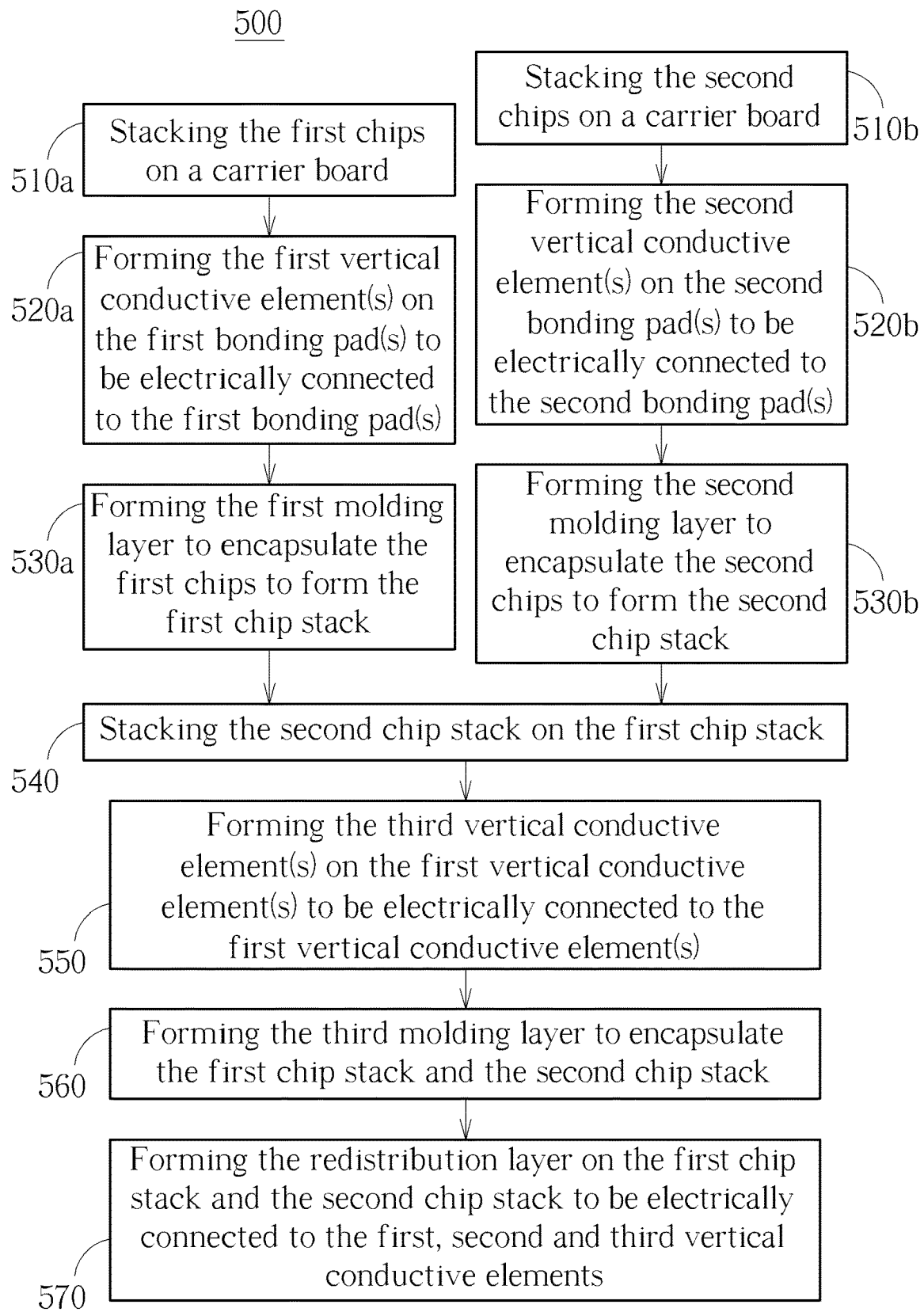
FIG. 5 is a flow diagram showing a manufacturing method of a chip package structure according to an embodiment of the present invention.

Referring to FIG. 5, FIG. 5 is a flow diagram showing a manufacturing method of a chip package structure according to an embodiment of the present invention. It is to be appreciated that the flow diagram shown in FIG. 5 is exemplary. In some embodiments, some of the steps may be performed simultaneously, or in a different order than shown in FIG. 5. In some embodiments, any other suitable step may be added in the method 500 before or after one of the existing step of the method 500. Regarding the following contents, the method 500 shall be described with reference to FIG. 5. However, the method 500 is not limited to those exemplary embodiments.

In order to explain the method 500 more clearly, FIG. 6A to FIG. 6K and FIG. 3 are further referred. FIG. 6A to FIG. 6K are schematic diagrams respectively illustrating statuses in a manufacturing method of a chip package structure 300 according to an embodiment of the present invention. Note that FIG. 6A to FIG. 6K and FIG. 3 are further referred to show the manufacturing process of the chip package structure 300 shown in FIG. 3 (i.e. the chip package structure 300 of the third embodiment).

Figure 6A:
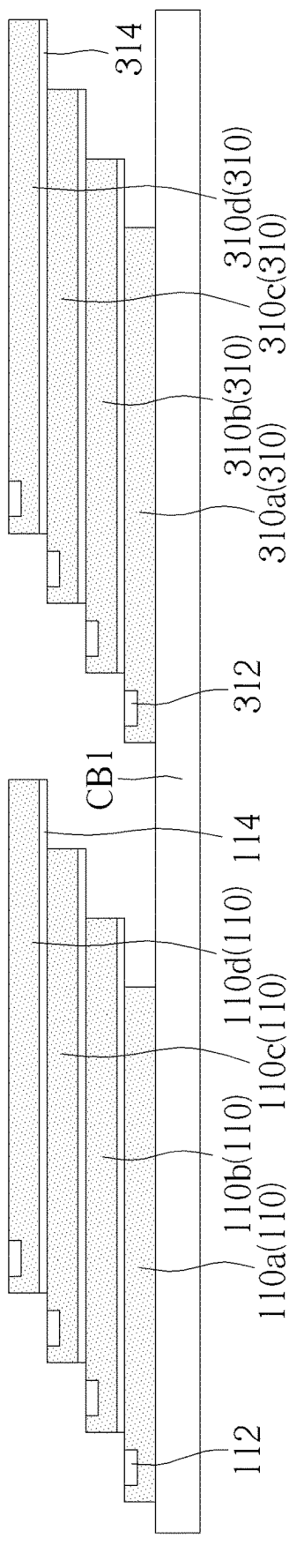
FIG. 6A to FIG. 6K are schematic diagrams respectively illustrating statuses in a manufacturing method of a chip package structure according to an embodiment of the present invention.

In the step 510a of FIG. 5, the first chips 110 are stacked on a carrier board CB1 (as shown in FIG. 6A). For example, in FIG. 6A, the first chips 110 are stacked in a form of staircase, such that the first bonding pads 112 are not covered by the first chips 110. Moreover, the die attach films 114 may be disposed on the bottom surfaces of some first chips 110b, 110c and 110d, such that the first chips 110 may be adhered to each other.

Figure 6B:
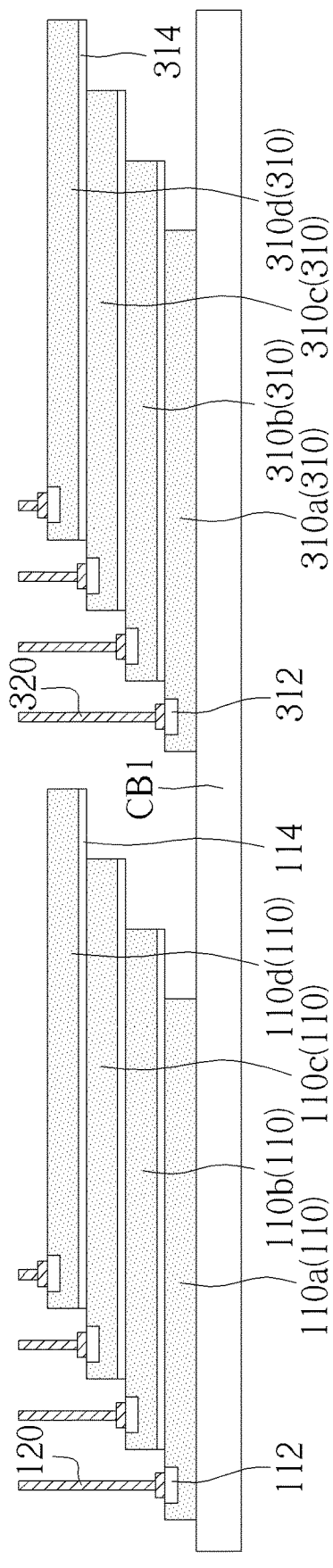

In the step 520a of FIG. 5, the first vertical conductive element(s) 120 is/are formed on the first bonding pad(s) 112 to be electrically connected to the first bonding pad(s) 112 (as shown in FIG. 6B). In some embodiments, the first vertical conductive element(s) 120 may be formed by a bonding process, wherein an end of the first vertical conductive element 120 is bonded on the first bonding pad 112, and another end of the first vertical conductive element 120 is not in contact with anything. Thus, the extending direction of the first vertical conductive element 120 may be substantially parallel to the normal direction Dn of the first chip stack CS1.

Optionally, in some embodiments, the connecting wire 210 (referring to FIG. 2) electrically connected between two of the first bonding pads 112 respectively belonging to two of the first chips 110 may be formed, but not limited thereto.

Figure 6C:
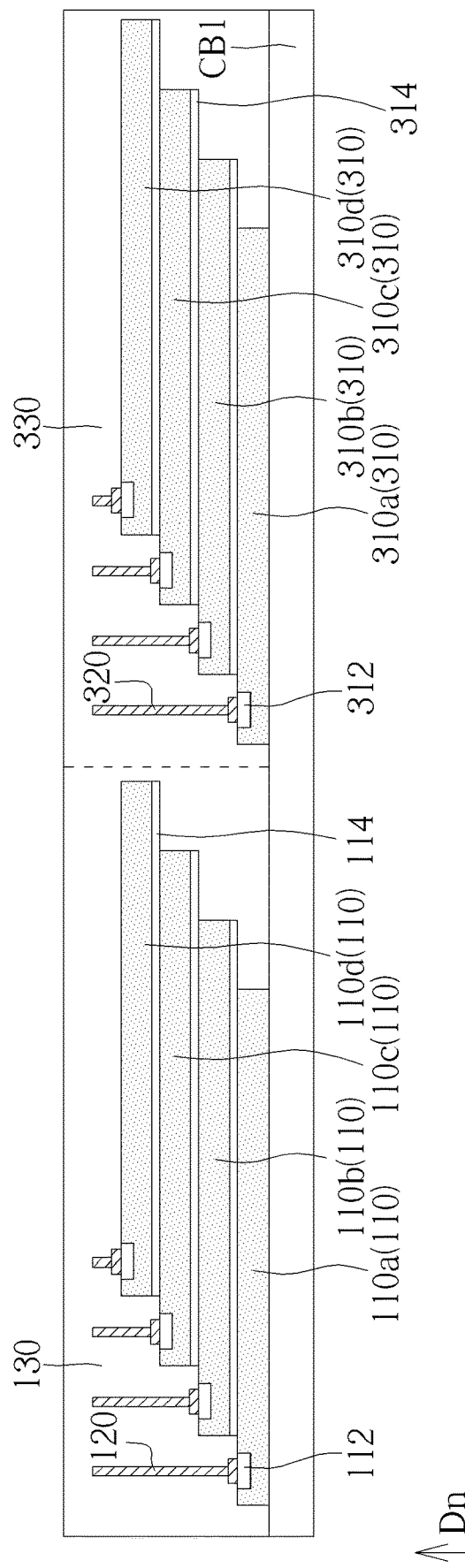
Figure 6D:
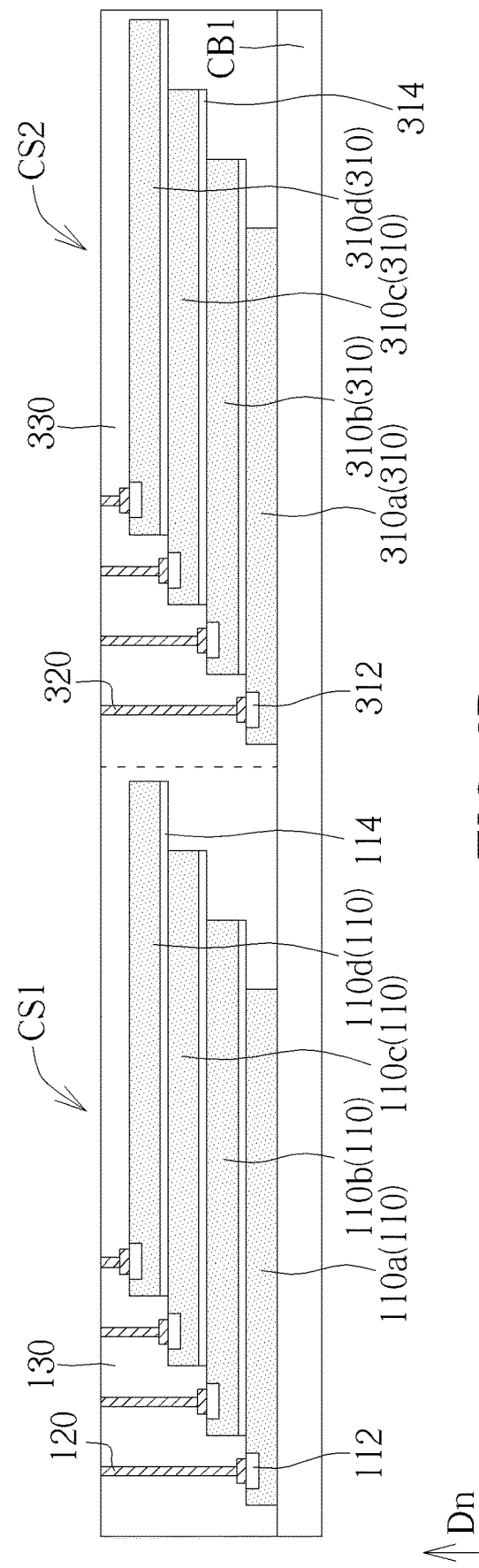

In the step 530a of FIG. 5, the first molding layer 130 is formed to encapsulate the first chips 110 to form the first chip stack CS1 (as shown in FIG. 6C and FIG. 6D), wherein the first chip stack CS1 includes the first chips 110, the first vertical conductive element(s) 120 and the first molding layer 130.

In detail, as shown in FIG. 6C, the first molding layer 130 is formed to cover the first chips 110 and the first vertical conductive element(s) 120. Then, as shown in FIG. 6D, the surface of the first molding layer 130 is thinned to expose an end of each first vertical conductive element 120. In other words, the step of forming the first molding layer 130 may include: thinning the surface of the first molding layer 130 to expose an end of each first vertical conductive element 120. Therefore, the first vertical conductive element(s) 120 may be electrically connected to the component formed on the first molding layer 130 in the subsequent manufacturing process. Moreover, this thinning step uses the chemical mechanical polishing (CMP) or any other suitable process. In addition, after the first molding layer 130 is formed, the first vertical conductive element(s) 120 may penetrate through the first molding layer 130.

Optionally, in some embodiments, the sub redistribution layer 440 (referring to FIG. 4) may be formed on the first molding layer 130 after the first molding layer 130 is formed, but not limited thereto.

In the step 510b of FIG. 5, the second chips 310 are stacked on a carrier board CB1 (as shown in FIG. 6A). For example, in FIG. 6A, the second chips 310 are stacked in a form of staircase, such that the second bonding pads 312 are not covered by the second chips 310. Moreover, the die attach films 314 may be disposed on the bottom surfaces some second chips 310b, 310c and 310d, such that the second chips 310 may be adhered to each other.

In the step 520b of FIG. 5, the second vertical conductive element(s) 320 is/are formed on the second bonding pad(s) 312 to be electrically connected to the second bonding pad(s) 312 (as shown in FIG. 6B). In some embodiments, the second vertical conductive element(s) 320 may be formed by a bonding process, wherein an end of the second vertical conductive element 320 is bonded on the second bonding pad 312, and another end of the second vertical conductive element 320 is not in contact with anything. Thus, the extending direction of the second vertical conductive element 320 may be substantially parallel to the normal direction of the second chip stack CS2 (e.g., in some embodiments, the second vertical conductive element 320 may be substantially parallel to the normal direction Dn of the first chip stack CS1).

In the step 530b of FIG. 5, the second molding layer 330 is formed to encapsulate the second chips 310 to form the second chip stack CS2 (as shown in FIG. 6C and FIG. 6D), wherein the second chip stack CS2 includes the second chips 310, the second vertical conductive element(s) 320 and the second molding layer 330.

In detail, as shown in FIG. 6C, the second molding layer 330 is formed to cover the second chips 310 and the second vertical conductive element(s) 320. Then, as shown in FIG. 6D, the surface of the second molding layer 330 is thinned to expose an end of each second vertical conductive element 320, such that the second vertical conductive element(s) 320 may be electrically connected to the component formed on the second molding layer 330 in the subsequent manufacturing process. Moreover, this thinning step uses the chemical mechanical polishing (CMP) or any other suitable process. In addition, after the second molding layer 330 is formed, the second vertical conductive element(s) 320 may penetrate through the second molding layer 330.

In some embodiments, as shown in FIG. 5 and FIG. 6A, the carrier board in the step 510a may be the same as the carrier board in the step 510b; that is to say, the first chips 110 and the second chips 310 may be stacked on the same carrier board CB1, but not limited thereto. Therefore, the step 510a and the step 510b may be performed simultaneously. In some embodiments (not shown in figure), the carrier board in the step 510a may be different from the carrier board in the step 510b, and the step 510a and the step 510b may not be performed simultaneously.

In some embodiments, as shown in FIG. 5 and FIG. 6B to FIG. 6D, the step 520a and the step 520b may be performed simultaneously, and the step 530a and the step 530b may be performed simultaneously, such that the first chip stack CS1 and the second chip stack CS2 are formed on the same carrier board CB1, and the first molding layer 130 and the second molding layer 330 are formed of the same material, but not limited thereto. As shown in FIG. 6C and FIG. 6D, the first molding layer 130 and the second molding layer 330 are directly connected to each other, but not limited thereto.

Figure 6E:
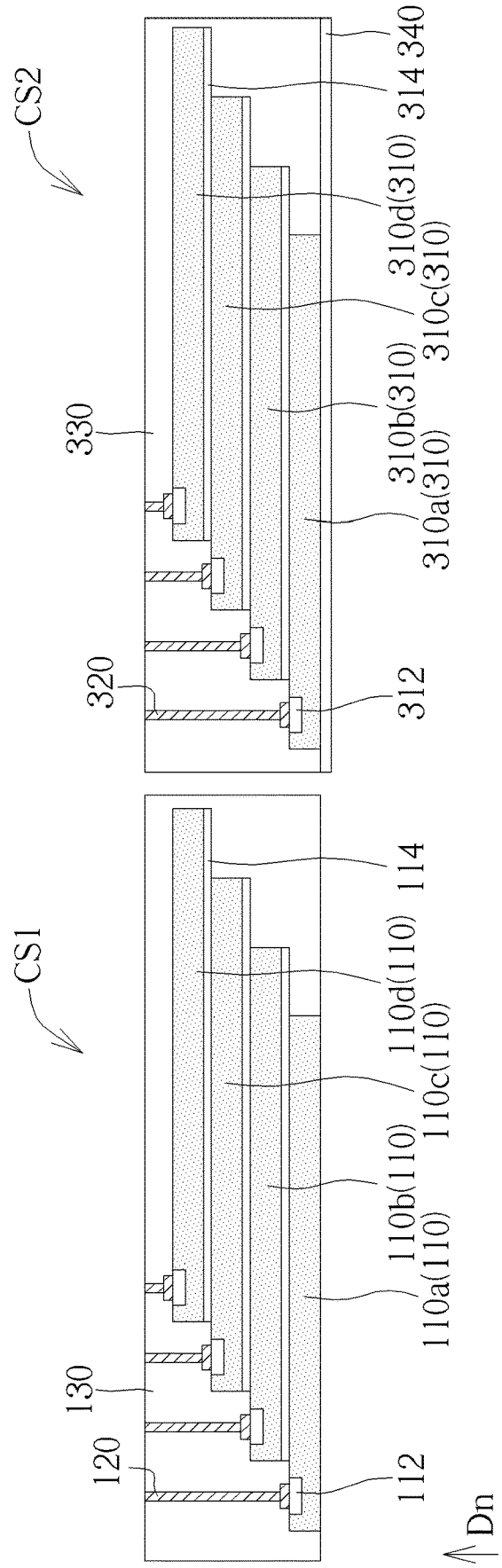

Then, in some embodiments, some step may be added in the method 500. For example, since the first chip stack CS1 and the second chip stack CS2 are formed on the same carrier board CB1 in FIG. 6D, a step for removing the carrier board CB1 and a step for separating the first chip stack CS1 from the second chip stack CS2 are performed. More precisely, as shown in FIG. 6E, the carrier board CB1 may be removed, such that the first chip stack CS1 and the second chip stack CS2 may be separated from the carrier board CB1. In some embodiments, a debonding process may be performed for separating the first chip stack CS1 and the second chip stack CS2 from the carrier board CB1, but not limited thereto. Then, the first chip stack CS1 and the second chip stack CS2 may be separated from each other. In some embodiments, a cutting process may be performed for separating the first chip stack CS1 from the second chip stack CS2, but not limited thereto. Optionally, the die attach film 340 may be further formed on the bottom surface of the second chip stack CS2 after separating the first chip stack CS1 from the second chip stack CS2.

Figure 6F:
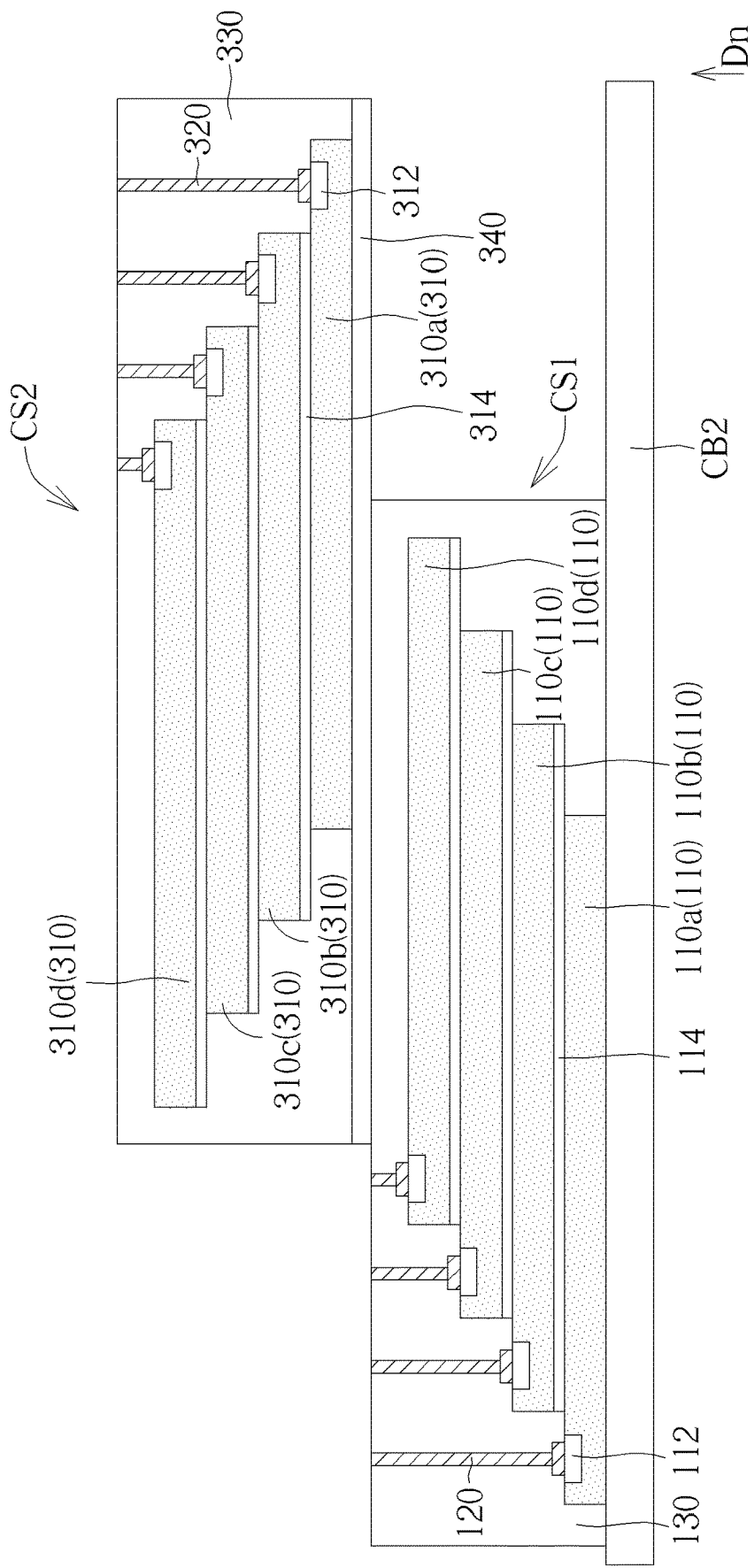

In the step 540 of FIG. 5, the second chip stack CS2 is stacked on the first chip stack CS1 (as shown in FIG. 6F). In detail, the first chip stack CS1 may be disposed on another carrier board CB2, and then, the second chip stack CS2 is stacked on the first chip stack CS1, wherein this carrier board CB2 may be the same as or different from the aforementioned carrier board CB1. For example, in FIG. 6F, the second chip stack CS2 may be stacked on the first chip stack CS1 in a form of staircase, such that the first bonding pads 112 are not covered by the second chip stack CS2. Moreover, in some embodiments, the second chip stack CS2 and the first chip stack CS1 are adhered to each other through the die attach film 340 formed on the bottom surface of the second chip stack CS2.

Figure 6G:
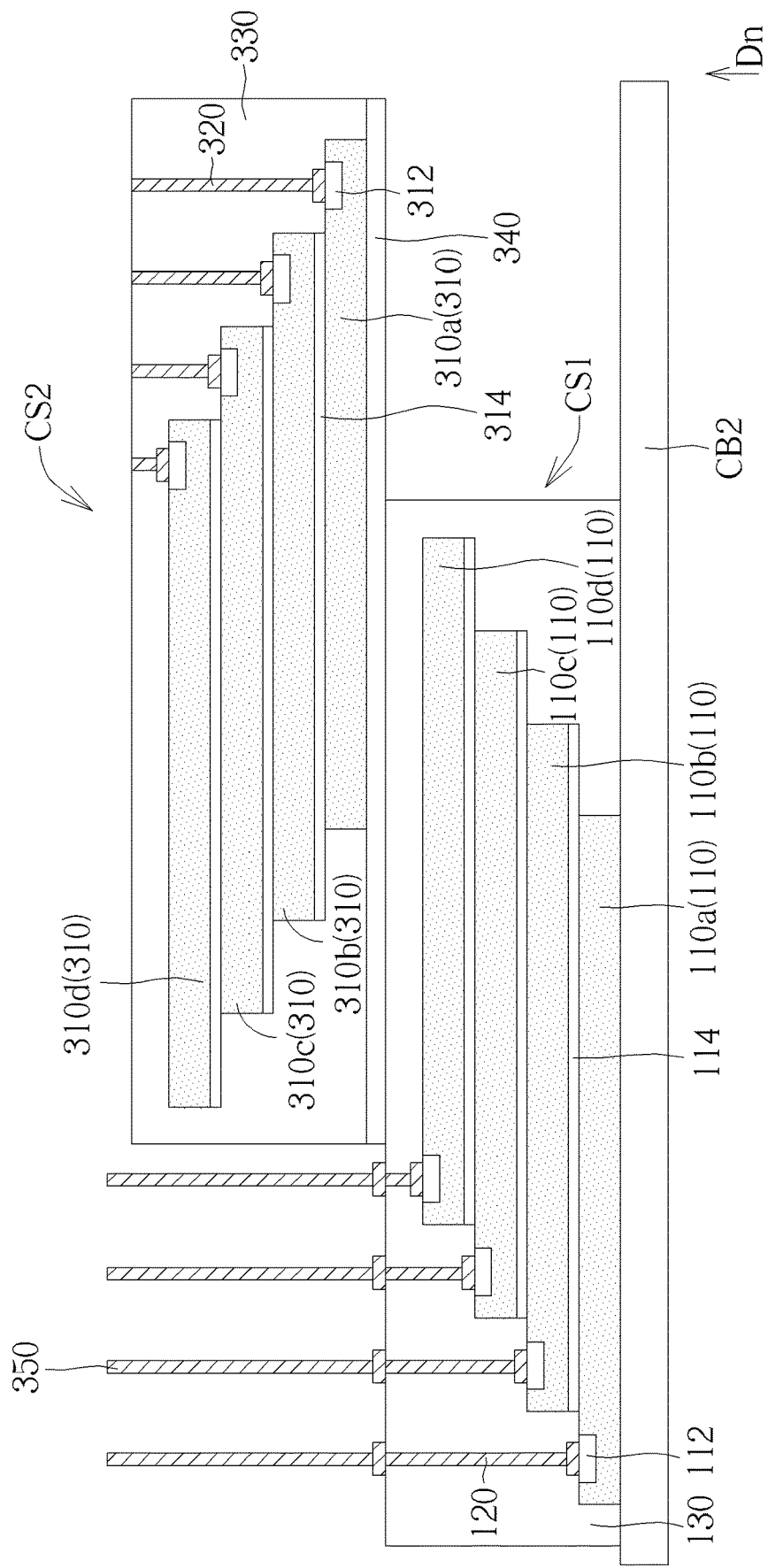

In the step 550 of FIG. 5, the third vertical conductive element(s) 350 is/are formed on the first vertical conductive element(s) 120 to be electrically connected to the first vertical conductive element(s) 120 (as shown in FIG. 6G). The forming process of the third vertical conductive element 350 is similar to the forming process of the first vertical conductive element 120. In some embodiments, the third vertical conductive element(s) 350 may be formed by a bonding process, wherein an end of the third vertical conductive element 350 is bonded on the first vertical conductive element 120, and another end of the third vertical conductive element 350 is not in contact with anything. Thus, the extending direction of the third vertical conductive element 350 may be substantially parallel to the normal direction Dn of the first chip stack CS1.

Figure 6H:
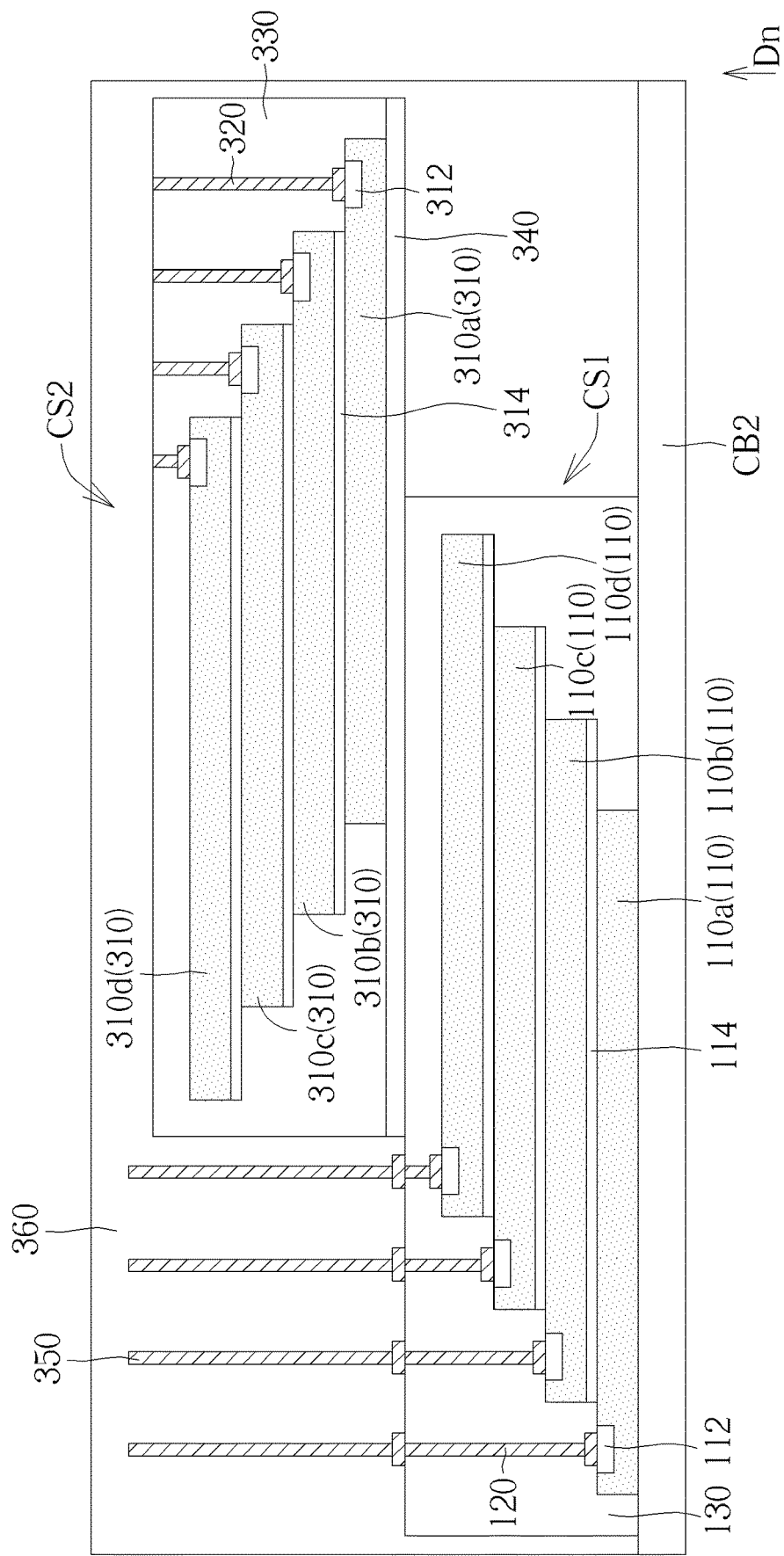
Figure 6I:
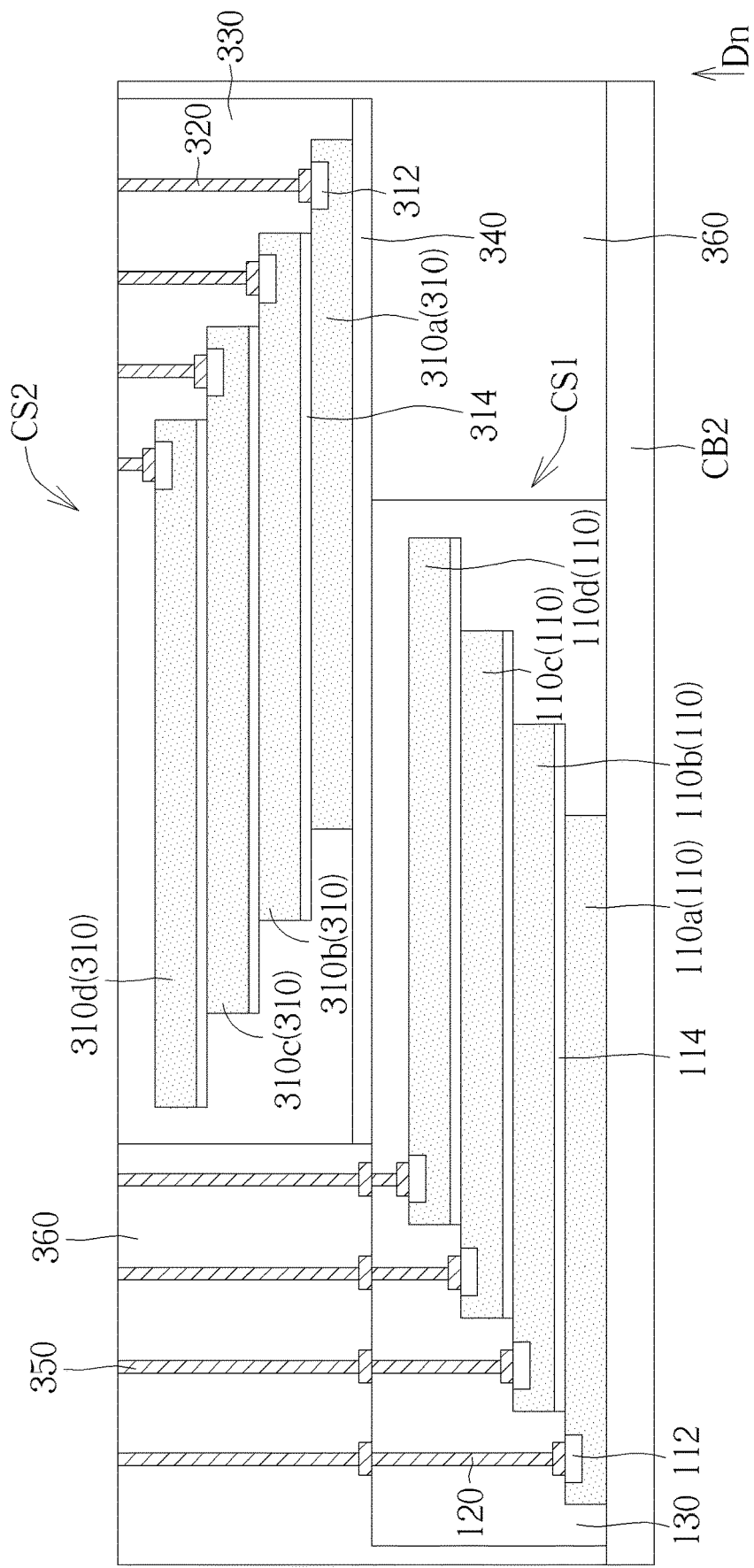

In the step 560 of FIG. 5, the third molding layer 360 is formed to encapsulate the first chip stack CS1 and the second chip stack CS2 (as shown in FIG. 6H and FIG. 6I). In detail, as shown in FIG. 6H, the third molding layer 360 is formed to cover the first chip stack CS1, the second chip stack CS2 and the third vertical conductive element(s) 350. Then, as shown in FIG. 6I, the surface of the third molding layer 360 is thinned to expose an end of each third vertical conductive element 350 and an end of each second vertical conductive element 320. Therefore, the third vertical conductive element(s) 350 and the second vertical conductive element(s) 320 may be electrically connected to the component formed in the subsequent manufacturing process. Moreover, this thinning step uses the chemical mechanical polishing or any other suitable process. In addition, after the third molding layer 360 is formed, the third vertical conductive element(s) 350 may penetrate through the third molding layer 360.

Figure 6J:
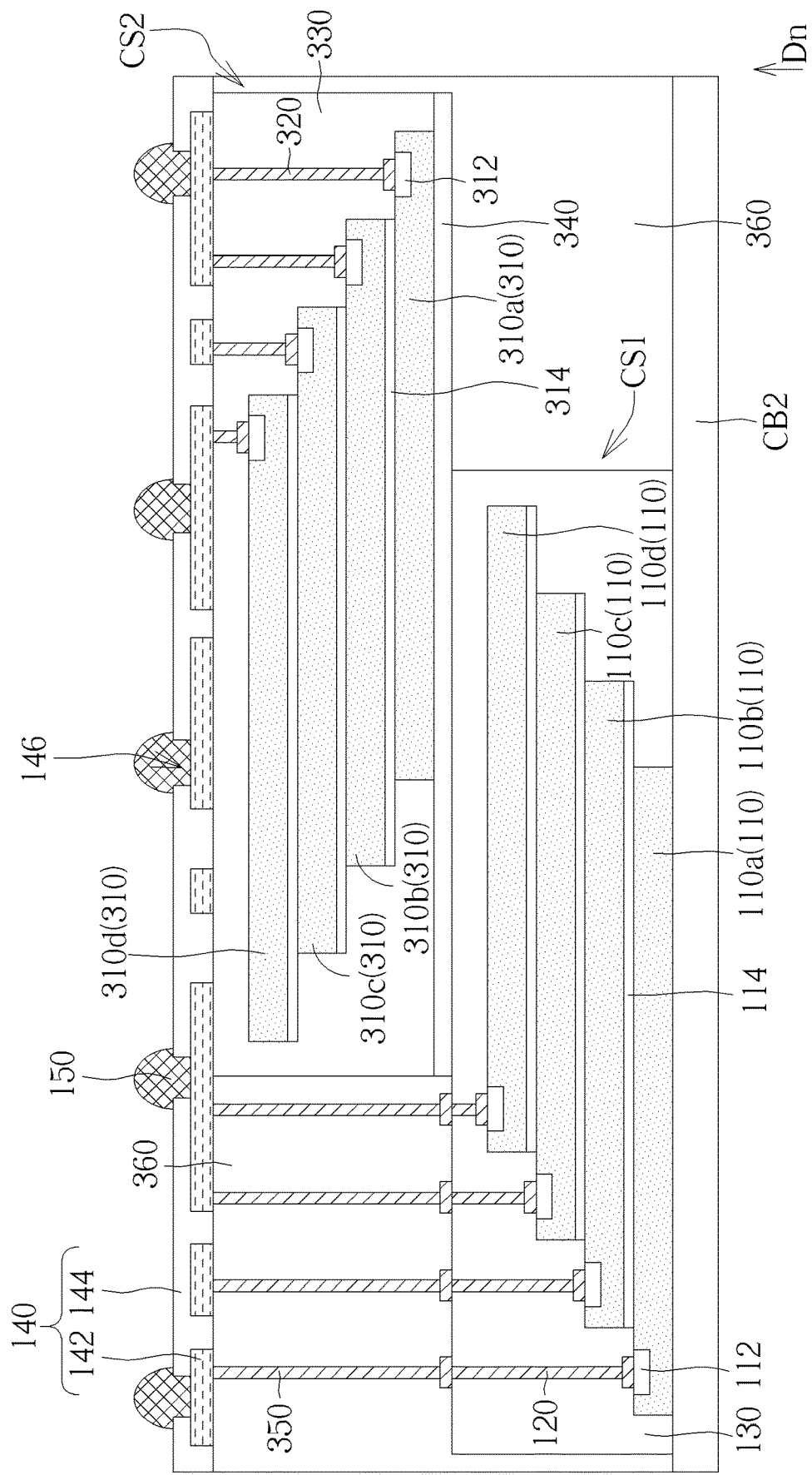

In the step 570 of FIG. 5, the redistribution layer 140 is formed on the first chip stack CS1 and the second chip stack CS2 to being electrically connected to the first, second and third vertical conductive elements 120, 320 and 350 (as shown in FIG. 6J). The redistribution layer 140 may include at least one conductive layer 142 and at least one insulating layer 144, wherein the conductive layer 142 may be electrically connected to the first vertical conductive elements 120. In FIG. 6J, for instance, the conductive layer 142 may be formed and patterned on the first chip stack CS1 and second chip stack CS2, so as to electrically connected to the first, second and third vertical conductive elements 120, 320 and 350 (in FIG. 6J, the conductive layer 142 may be in contact with the ends of the first, second and third vertical conductive elements 120, 320 and 350); and then, the insulating layer 144 may be formed on the conductive layer 142, and the insulating layer 144 may be patterned to form the openings 146 to expose the plurality of portions of the conductive layer 142, but not limited thereto. In addition, the conductive layer 142 and the insulating layer 144 may be formed by one or more thin film deposition processes including, but not limited to, a chemical vapor deposition (CVD), a physical vapor deposition (PVD), an atomic layer deposition (ALD) or any combination thereof; and the conductive layer 142 and the insulating layer 144 may be patterned by, but not limited to, a photolithography process.

Furthermore, a plurality of solder balls 150 may be formed on the redistribution layer 140. More precisely, the solder balls 150 may be formed on the redistribution layer 140 and corresponding to the openings 146.

Figure 6K:
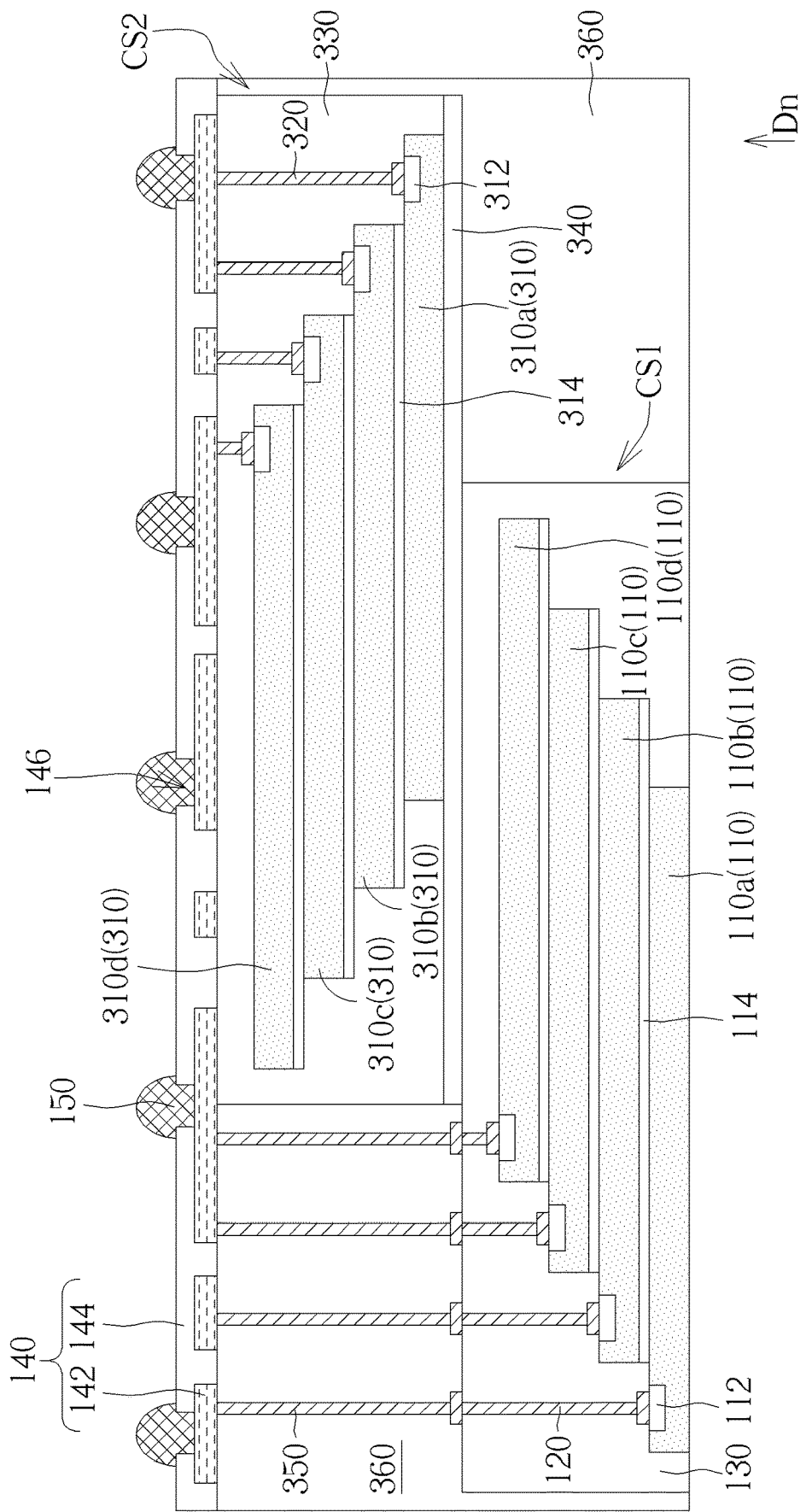

Then, in FIG. 6K, the carrier board CB2 may be removed. In some embodiments, a debonding process may be performed for separating the first chip stack CS1 from the carrier board CB2, but not limited thereto.

Optionally, the protecting layer 160 may be formed on a side of the first chip stack CS1 opposite to the redistribution layer 140, so as to complete the chip package structure 300 shown in FIG. 3. In some embodiments, the protecting layer 160 may be adhered on the first chip stack CS1, but not limited thereto.

Figure 7:
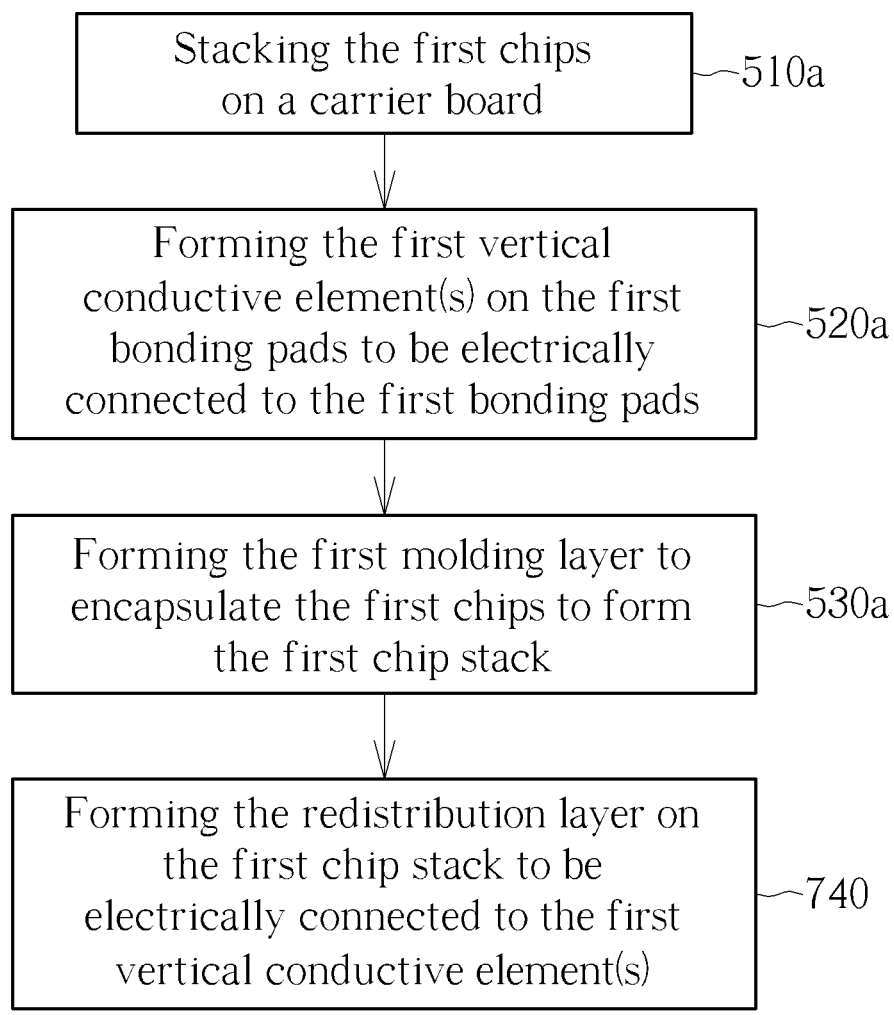
FIG. 7 is a flow diagram showing a manufacturing method of a chip package structure according to another embodiment of the present invention.

Referring to FIG. 7, FIG. 7 is a flow diagram showing a manufacturing method of a chip package structure according to another embodiment of the present invention. It is to be appreciated that the flow diagram shown in FIG. 7 is exemplary. In some embodiments, some of the steps may be performed simultaneously, or in a different order than shown in FIG. 7. In some embodiments, any other suitable step may be added in the method 700 before or after one of the existing step of the method 700. Regarding the following contents, the method 700 shall be described with reference to FIG. 7. However, the method 700 is not limited to those exemplary embodiments.

Figure 8:
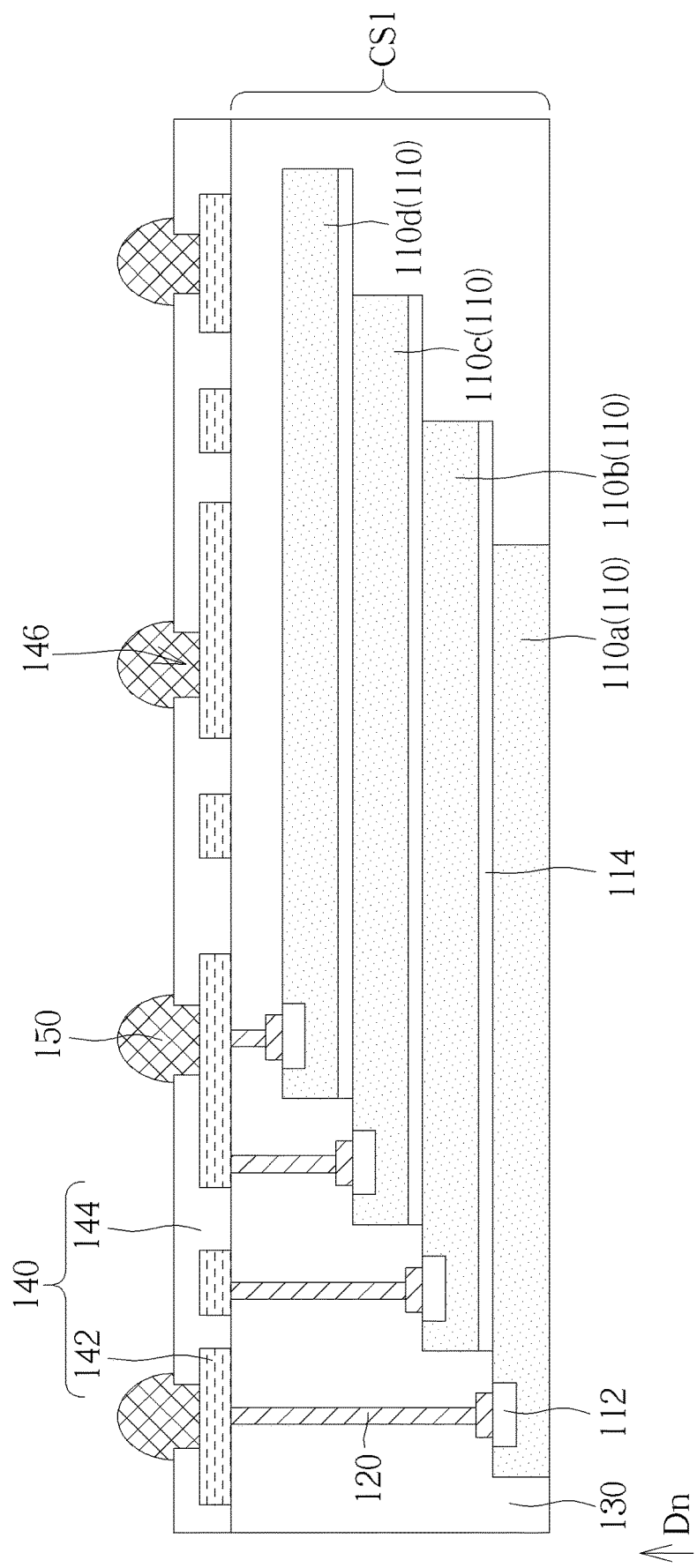
FIG. 8 is a schematic diagram illustrating a status in a manufacturing method of a chip package structure according to another embodiment of the present invention.

In order to explain the method 700 more clearly, FIG. 6A to FIG. 6D, FIG. 8 and FIG. 1 are further referred. FIG. 8 is a schematic diagram illustrating a status in a manufacturing method of a chip package structure according to another embodiment of the present invention. Note that FIG. 6A to FIG. 6D, FIG. 8 and FIG. 1 are further referred to show the manufacturing process of the chip package structure 100 shown in FIG. 1 (i.e. the chip package structure 100 of the first embodiment).

The explanation of the steps 510a, 520a and 530a of FIG. 7 may be referred to the above content and FIG. 5, so the steps 510a, 520a and 530a will not be redundantly described. Note that, the second chip stack CS2 shown in FIG. 6A to FIG. 6D may not be formed in this embodiment.

In the step 740 of FIG. 7, the redistribution layer 140 is formed on the first chip stack CS1 to being electrically connected to the first vertical conductive element(s) 120 (as shown in FIG. 8). The forming method of the redistribution layer 140 may be referred to the above content, and the repeated parts will not be redundantly described. Furthermore, the solder balls 150 may be formed on the redistribution layer 140 and corresponding to the openings 146.

Then, the carrier board CB1 may be removed. In some embodiments, a debonding process may be performed for separating the first chip stack CS1 from the carrier board CB1, but not limited thereto.

Optionally, the protecting layer 160 may be formed on a side of the first chip stack CS1 opposite to the redistribution layer 140, so as to complete the chip package structure 100 shown in FIG. 1.

In summary, due to the design of the chip package structure of the present invention, the chip package structure has a reduced lateral size, and the signal transmitting path between the chips of the chip package structure and the external device may be decreased. Furthermore, the design time and the cost of the chip package structure can be decreased. On the other hand, in the manufacturing process, the reliability of the chip package structure can be improved when the offset of the chip exists.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A chip package structure, comprising:
   a first chip stack comprising:
      a plurality of first chips sequentially stacked, wherein each of the plurality of first chips comprises at least one first bonding pad;
      a first molding layer encapsulating the plurality of first chips; and
      at least one first vertical conductive element penetrating through the first molding layer, wherein the at least one first vertical conductive element is disposed on and electrically connected to at least one of the first bonding pads;
   a redistribution layer disposed on the first chip stack and electrically connected to the at least one first vertical conductive element; and
   a second chip stack disposed between the first chip stack and the redistribution layer, wherein the second chip stack comprises:
      a plurality of second chips sequentially stacked, wherein each of the plurality of second chips comprises at least one second bonding pad;
      a second molding layer encapsulating the plurality of second chips; and
      at least one second vertical conductive element penetrating through the second molding layer, wherein the at least one second vertical conductive element is disposed on and electrically connected to at least one of the second bonding pads, and the at least one second vertical conductive element is electrically connected to the redistribution layer.

2. The chip package structure of claim 1, further comprising a third molding layer and at least one third vertical conductive element, wherein the third molding layer encapsulates the first chip stack and the second chip stack, the at least one third vertical conductive element penetrates through the third molding layer, the at least one third vertical conductive element is disposed on and electrically connected to the at least one first vertical conductive element, and the at least one third vertical conductive element is electrically connected to the redistribution layer.

3. The chip package structure of claim 2, wherein an extending direction of the at least one third vertical conductive element is substantially parallel to a normal direction of the first chip stack.

4. The chip package structure of claim 2, wherein the first chip stack further comprises a sub redistribution layer disposed between the at least one first vertical conductive element and the at least one third vertical conductive element.

5. The chip package structure of claim 1, wherein the second chip stack is stacked on the first chip stack in a form of staircase.

6. The chip package structure of claim 1, wherein an extending direction of the at least one first vertical conductive element is substantially parallel to a normal direction of the first chip stack.

7. The chip package structure of claim 1, wherein the plurality of first chips are stacked in a form of staircase.

8. The chip package structure of claim 1, further comprising a protecting layer disposed on a side of the first chip stack opposite to the redistribution layer.

9. The chip package structure of claim 1, wherein the first chip stack further comprises a connecting wire electrically connected between two of the first bonding pads respectively belonging to two of the plurality of first chips.

10. A manufacturing method of a chip package structure, comprising:
    stacking a plurality of first chips on a carrier board, wherein each of the plurality of first chips has at least one first bonding pad;
    forming at least one first vertical conductive element on at least one of the first bonding pads to being electrically connected to the at least one of the first bonding pads;
    forming a first molding layer to encapsulate the plurality of first chips to form a first chip stack, wherein the at least one first vertical conductive element penetrates through the first molding layer, and the first chip stack comprises the plurality of first chips, the at least one first vertical conductive element and the first molding layer;
    stacking a second chip stack on the first chip stack, wherein the second chip stack comprises:
        a plurality of second chips sequentially stacked, wherein each of the plurality of second chips comprises at least one second bonding pad;
        a second molding layer encapsulating the plurality of second chips; and
        at least one second vertical conductive element penetrating through the second molding layer, wherein the at least one second vertical conductive element is disposed on and electrically connected to at least one of the second bonding pads; and
    forming a redistribution layer on the first chip stack and the second chip stack to being electrically connected to the at least one first vertical conductive element and the at least one second vertical conductive element.

11. The manufacturing method of the chip package structure of claim 10, wherein a forming method of the second chip stack comprises:
    stacking the plurality of second chips;
    forming the at least one second vertical conductive element on the at least one of the second bonding pads; and
    forming the second molding layer to encapsulate the plurality of second chips.

12. The manufacturing method of the chip package structure of claim 10, wherein before the step of forming the redistribution layer, the manufacturing method further comprises:
    forming at least one third vertical conductive element on the at least one first vertical conductive element to being electrically connected to the at least one first vertical conductive element; and
    forming a third molding layer to encapsulate the first chip stack and the second chip stack, wherein the at least one third vertical conductive element penetrates through the third molding layer,
    wherein the redistribution layer is electrically connected to the at least one third vertical conductive element.

13. The manufacturing method of the chip package structure of claim 10, wherein the first chip stack and the second chip stack are formed on the same carrier board.

14. The manufacturing method of the chip package structure of claim 10, wherein the second chip stack is stacked on the first chip stack in a form of staircase.

15. The manufacturing method of the chip package structure of claim 10, wherein the step of forming the first molding layer comprises:
    thinning a surface of the first molding layer to expose an end of the at least one first vertical conductive element.

16. The manufacturing method of the chip package structure of claim 10, wherein the plurality of first chips are stacked in a form of staircase.

17. The manufacturing method of the chip package structure of claim 10, further comprising:
    removing the carrier board.

18. The manufacturing method of the chip package structure of claim 17, wherein after the step of removing the carrier board, the manufacturing method comprises:
    forming a protecting layer on a side of the first chip stack opposite to the redistribution layer.

* * * * *